(12) United States Patent
Iwaki

(10) Patent No.: US 12,407,327 B2
(45) Date of Patent: Sep. 2, 2025

(54) ACOUSTIC WAVE FILTER WITH WIDE BANDWIDTH OF ATTENUATION REGION

(71) Applicant: SKYWORKS SOLUTIONS, INC., Irvine, CA (US)

(72) Inventor: Masafumi Iwaki, Osaka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 307 days.

(21) Appl. No.: 18/164,139

(22) Filed: Feb. 3, 2023

(65) Prior Publication Data

US 2023/0253952 A1 Aug. 10, 2023

Related U.S. Application Data

(60) Provisional application No. 63/307,684, filed on Feb. 8, 2022.

(51) Int. Cl.
| | | |
|---|---|---|
| *H03H 9/56* | (2006.01) | |
| *H03H 9/13* | (2006.01) | |
| *H03H 9/17* | (2006.01) | |

(52) U.S. Cl.
CPC ............ *H03H 9/568* (2013.01); *H03H 9/133* (2013.01); *H03H 9/173* (2013.01)

(58) Field of Classification Search
CPC ........ H03H 9/6483; H03H 9/725; H03H 9/25; H03H 9/02834; H03H 9/02574; H03H 9/14541; H03H 9/568; H03H 9/72; H03H 9/02559; H03H 9/706; H03H 9/02228; H03H 9/6436; H03H 9/205; H03H 9/605; H03H 9/02015; H03H 9/02102; H03H 9/02992; H03H 9/173; H03H 9/64; H03H 9/133; H03H 9/145; H03H 9/14582; H03H 9/175; H03H 9/542; H03H 9/6406; H03H 9/6476; H03F 2200/451; H03F 3/195; H03F 2200/111; H03F 3/19; H03F 1/56; H03F 2200/294; H03F 2203/7209; H03F 3/245; H03F 3/72; H04B 1/40; H04B 1/0057

See application file for complete search history.

(56) References Cited

U.S. PATENT DOCUMENTS

| | | | | |
|---|---|---|---|---|
| 7,619,347 B1 * | 11/2009 | Bhattacharjee | ...... | H03H 9/0038 310/313 C |
| 2012/0188026 A1 * | 7/2012 | Yamaji | ................ | H03H 9/6483 333/133 |
| 2020/0358424 A1 * | 11/2020 | Kaneda | .................... | H03H 9/25 |

* cited by examiner

*Primary Examiner* — Lincoln D Donovan
*Assistant Examiner* — Tyler J Pereny
(74) *Attorney, Agent, or Firm* — Lando & Anastasi, LLP

(57) ABSTRACT

An acoustic wave filter provided herein comprises a plurality of series resonators, and a plurality of shunt resonators disposed between the series resonators and a ground, at least one shunt resonator including a substrate, a pair of IDT electrodes disposed on the substrate, each of the IDT electrodes including a bus bar and a plurality of fingers extending from the bus bar, the plurality of fingers of the pair of IDT electrodes including a first group of fingers located at a center region of the pair of IDT electrodes and a second group of fingers located at edge regions on both sides of the center region, the first group of fingers having an average pitch distance shorter than an average pitch distance of the second group of fingers to improve a response at a rejection band of the acoustic wave filter.

21 Claims, 13 Drawing Sheets

ACOUSTIC WAVE FILTER WITH WIDE BANDWIDTH OF ATTENUATION REGION

CROSS-REFERENCE TO RELATED APPLICATIONS

This application claims priority under 35 U.S.C. § 119(e) to U.S. Provisional Patent Application Ser. No. 63/307,684, titled "ACOUSTIC WAVE FILTER WITH WIDE BANDWIDTH OF ATTENUATION REGION," filed Feb. 8, 2022, the entire content of which is incorporated herein by reference for all purposes.

BACKGROUND

Field

Aspects and embodiments disclosed herein relate to electronic systems, and in particular, to a filter for use in radio frequency (RF) electronics.

Description of the Related Technology

Filters are used in radio frequency (RF) communication systems to allow signals within specified frequency ranges to pass through and to reject frequencies outside of the specified ranges. An acoustic wave filter, which is used widely in the wireless communication field, can include a plurality of resonators arranged to filter a radio frequency signal. Examples of acoustic wave filters include surface acoustic wave (SAW) filters and bulk acoustic wave (BAW) filters. A film bulk acoustic resonator (FBAR) filter is an example of a BAW filter. Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer.

Examples of RF communication systems with one or more filter module include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

DETAILED DESCRIPTION OF EMBODIMENTS

Figure 1:
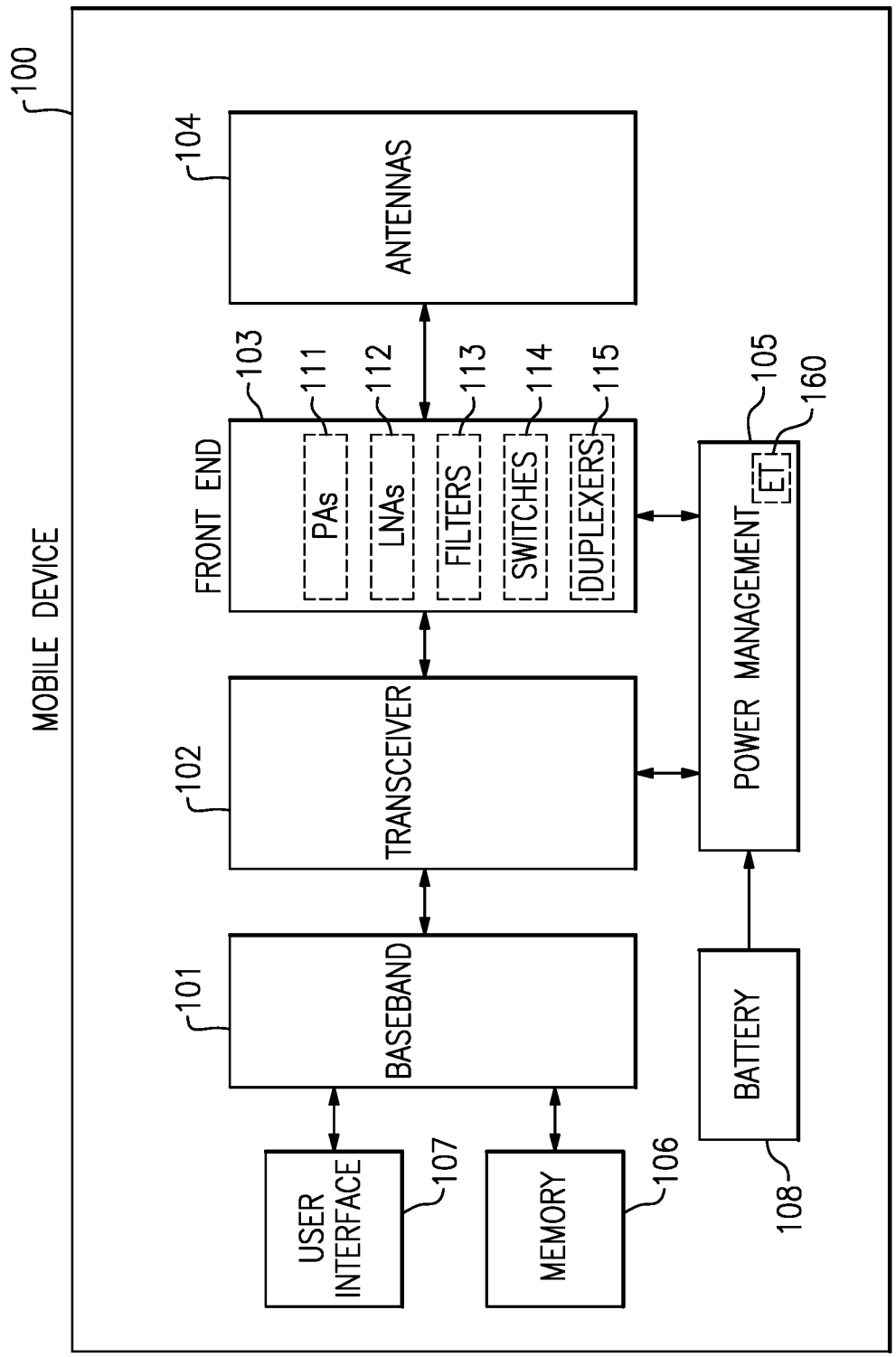
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100. The mobile device 100 includes a baseband system 101, a transceiver 102, a front end system 103, antennas 104, a power management system 105, a memory 106, a user interface 107, and a battery 108.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 1 as the transceiver 102. In one example, separate components (for instance, separate circuits or dies) can be provided for handling certain types of RF signals.

The front end system 103 aids is conditioning signals transmitted to and/or received from the antennas 104. In the illustrated embodiment, the front end system 103 includes power amplifiers (PAs) 111, low noise amplifiers (LNAs) 112, filters 113, switches 114, and duplexers 115. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 104 can include antennas used for a wide variety of types of communications. For example, the antennas 104 can include antennas associated transmitting and/or receiving signals associated with a wide variety of frequencies and communications standards.

In certain implementations, the antennas 104 support multiple-input-multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 103 can include phase shifters having variable phases controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving at the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 1, the baseband system 101 is coupled to the memory 106 to facilitate operation of the mobile device 100.

The memory 106 can be used for a wide variety of purposes, such as storing data and/or instructions to facilitate the operation of the mobile device 100 and/or to provide storage of user information.

The power management system 105 provides a number of power management functions of the mobile device 100. The power management system 105 of FIG. 1 includes an envelope tracker 160. As shown in FIG. 1, the power management system 105 receives a battery voltage form the battery 108. The battery 108 can be any suitable battery for use in the mobile device 100, including, for example, a lithium-ion battery.

The mobile device 100 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2A:
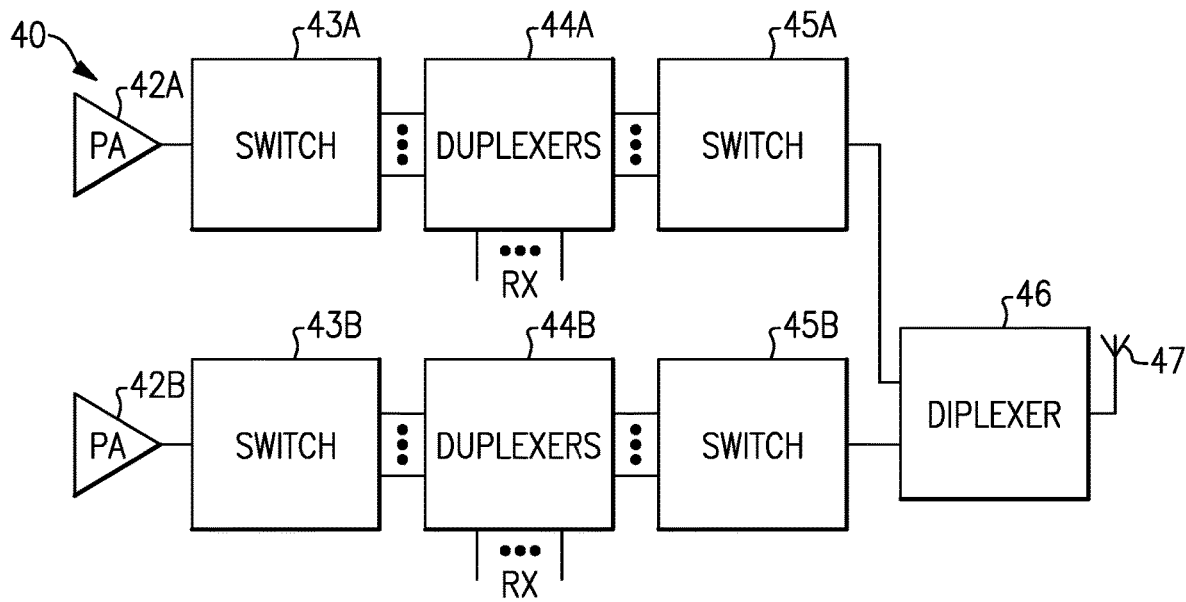
FIG. 2A is a schematic diagram of a carrier aggregation system.

FIG. 2A is a schematic diagram of a carrier aggregation system 40. The illustrated carrier aggregation system 40 includes power amplifiers 42A and 42B, switches 43A and 43B, duplexers 44A and 44B, switches 45A and 45B, diplexer 46, and antenna 47. The power amplifiers 42A and 42B can each transmit an amplified RF signal associated with a different carrier. The switch 43A can be a band select switch. The switch 43A can couple an output of the power amplifier 42A to a selected duplexer of the duplexers 44A. Each of the duplexers can include a transmit filter and receive filter. Any of the filters of the duplexers 44A and 44B can be implemented in accordance with any suitable principles and advantages discussed herein. The switch 45A can couple the selected duplexer of the duplexers 44A to the diplexer 46. The diplexer 46 can combine RF signals provided by the switches 45A and 45B into a carrier aggregation signal that is transmitted by the antenna 47. The diplexer 46 can isolate different frequency bands of a carrier aggregation signal received by the antenna 47. The diplexers 46 is an example of a frequency domain multiplexer. Other frequency domain multiplexers include a triplexer. Carrier aggregation systems that include triplexers can process carrier aggregation signals associated with three carriers. The switches 45A and 45B and selected receive filters of the duplexers 44A and 44B can provide RF signals with the isolated frequency bands to respective receive paths.

Figure 2B:
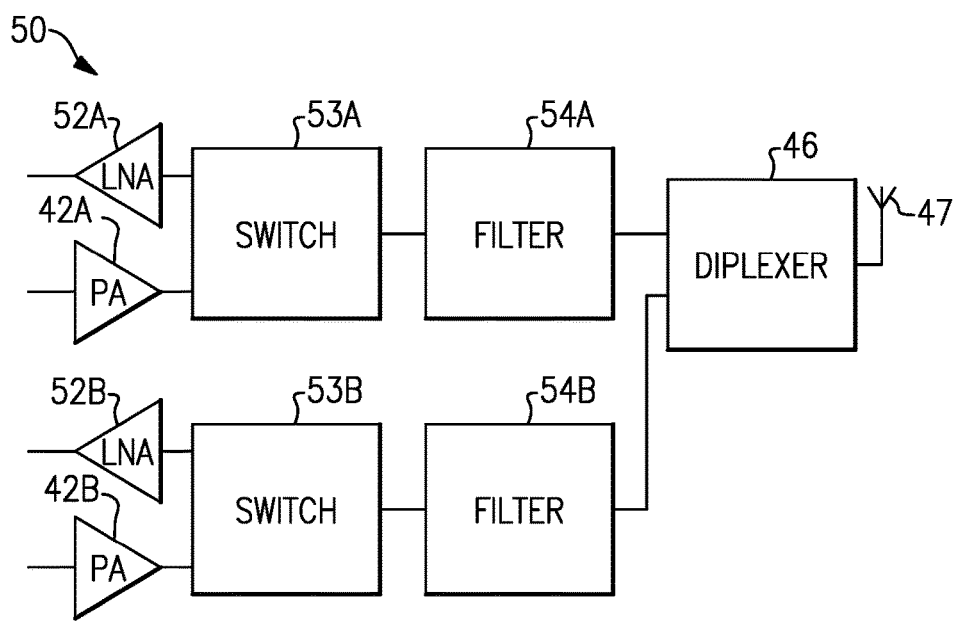
FIG. 2B is a schematic diagram of a carrier aggregation system.

FIG. 2B is a schematic diagram of a carrier aggregation system 50. The illustrated carrier aggregation system 50 includes power amplifiers 42A and 42B, low noise amplifiers 52A and 52B, switches 53A and 53B, filters 54A and 54B, diplexer 46, and antenna 47. The power amplifiers 42A and 42B can each transmit an amplified RF signal associated with a different carrier. The switch 53A can be a transmit/receive switch. The switch 53A can couple the filter 54A to an output of the power amplifier 42A in a transmit mode and to an input of the low noise amplifier 52A in a receive mode. The filter 54A and/or the filter 54B can be implemented in accordance with any suitable principles and advantages discussed herein. The diplexer 46 can combine RF signals from the power amplifiers 42A and 42B provided by the switches 53A and 53B into a carrier aggregation signal that is transmitted by the antenna 47. The diplexer 46 can isolate different frequency bands of a carrier aggregation signal received by the antenna 47. The switches 53A and 53B and the filters 54A and 54B can provide RF signals with the isolated frequency bands to respective low noise amplifiers 52A and 52B.

Figure 2C:
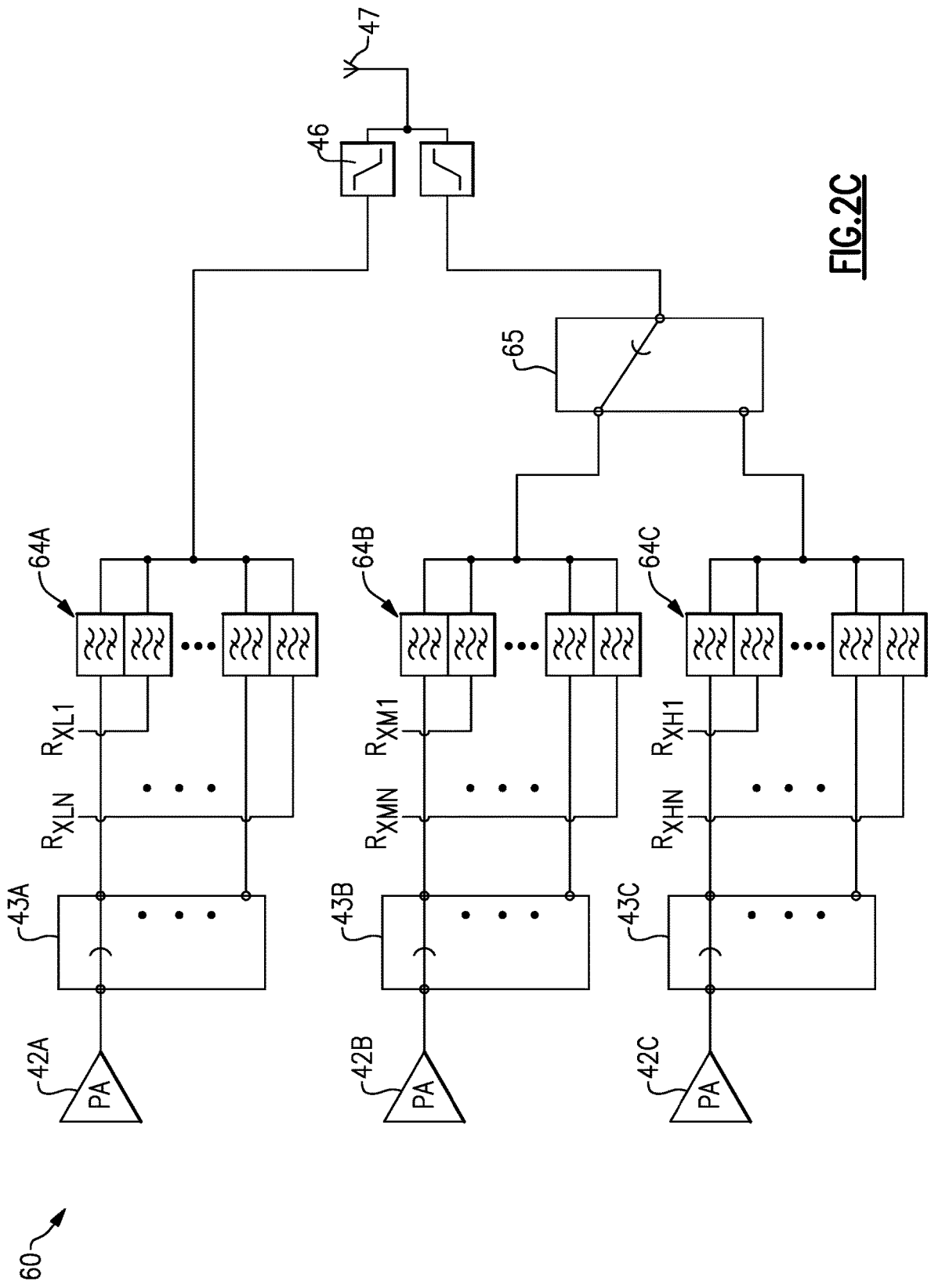
FIG. 2C is a schematic diagram of a carrier aggregation system.

FIG. 2C is a schematic diagram of a carrier aggregation system 60 that includes multiplexers in signal paths between power amplifiers and an antenna. The illustrated carrier aggregation system 60 includes a low band path, a medium band path, and a high band path. In certain implementations, a low band path can process radio frequency signals having a frequency of less than 1 GHz, a medium band path can process radio frequency signals having a frequency between 1 GHz and 2.2 GHz, and a high band path can process radio frequency signals having a frequency above 2.2 GHz.

A diplexer 46 can be included between RF signal paths and an antenna 47. The diplexer 46 can frequency multiplex radio frequency signals that are relatively far away in frequency. The diplexer 46 can be implemented with passive circuit elements having a relatively low loss. The diplexer 46 can combine (for transmit) and separate (for receive) carriers of carrier aggregation signals.

As illustrated, the low band path includes a power amplifier 42A configured to amplify a low band radio frequency signal, a band select switch 43A, and a multiplexer 64A. The band select switch 43A can electrically connect the output of the power amplifier 42A to a selected transmit filter of the multiplexer 64A. The selected transmit filter can be a band pass filter with a pass band corresponding to a frequency of an output signal of the power amplifier 42A. The multiplexer 64A can include any suitable number of transmit filters and any suitable number of receive filters. One or more of the transmit filters and/or one or more of the receive filters can be implemented in accordance with any suitable principles and advantages discussed herein. The multiplexer 64A can have the same number of transmit filters as receive filters. In some instances, the multiplexer 64A can have a different number of transmit filters than receive filters.

As illustrated in FIG. 2C, the medium band path includes a power amplifier 42B configured to amplify a medium band radio frequency signal, a band select switch 43B, and a multiplexer 64B. The band select switch 43B can electrically connect the output of the power amplifier 42B to a selected transmit filter of the multiplexer 64B. The selected transmit filter can be a band pass filter with a pass band corresponding to a frequency of an output signal of the power amplifier 42B. The multiplexer 64B can include any suitable number of transmit filters and any suitable number of receive filters. One or more of the transmit filters and/or one or more of the receive filters can be implemented in accordance with any suitable principles and advantages discussed herein. The multiplexer 64B can have the same number of transmit filters as receive filters. In some instances, the multiplexer 64B can have a different number of transmit filters than receive filters.

In the illustrated carrier aggregation system 60, the high band path includes a power amplifier 42C configured to amplify a high band radio frequency signal, a band select switch 43C, and a multiplexer 64C. The band select switch 43C can electrically connect the output of the power amplifier 42C to a selected transmit filter of the multiplexer 64C. The selected transmit filter can be a band pass filter with a pass band corresponding to a frequency of an output signal of the power amplifier 42C. The multiplexer 64C can include any suitable number of transmit filters and any suitable number of receive filters. One or more of the transmit filters and/or one or more of the receive filters can be implemented in accordance with any suitable principles and advantages discussed herein. The multiplexer 64C can have the same number of transmit filters as receive filters. In some instances, the multiplexer 64C can have a different number of transmit filters than receive filters.

A select switch 65 can selectively provide a radio frequency signal from the medium band path or the high band path to the diplexer 46. Accordingly, the carrier aggregation system 60 can process carrier aggregation signals with either a low band and high band combination or a low band and medium band combination.

Figure 2D:
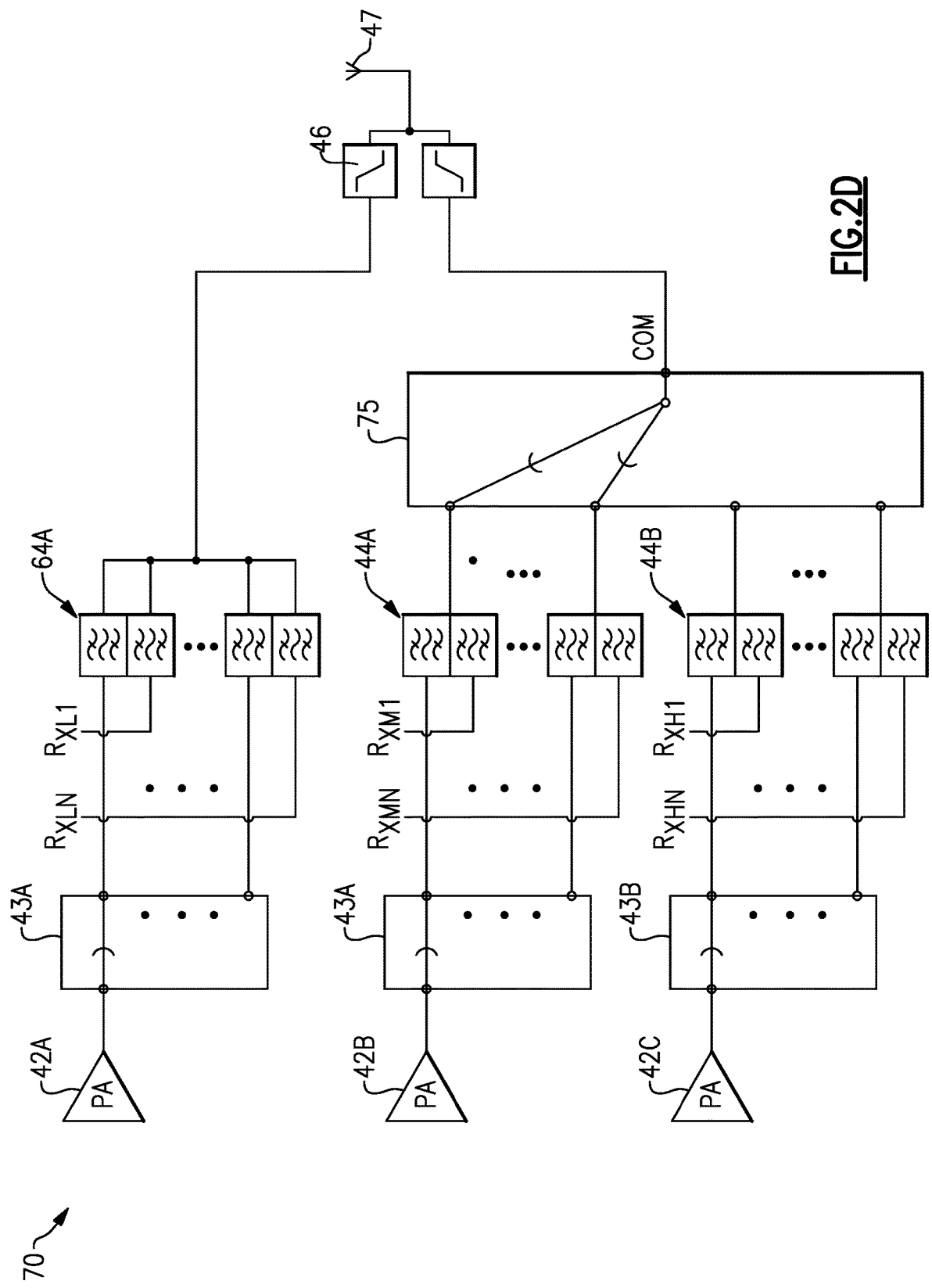
FIG. 2D is a schematic diagram of a carrier aggregation system.

FIG. 2D is a schematic diagram of a carrier aggregation system 70 that includes multiplexers in signal paths between power amplifiers and an antenna. The carrier aggregation system 70 is like the carrier aggregation system 60 of FIG. 2C, except that the carrier aggregation system 70 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a relatively larger number of filters included in multiplexer.

In the illustrated carrier aggregation system 70, duplexers 44B and 44C are selectively coupled to a diplexer 46 by way of a switch 75. The switch 75 is configured as a multi-close switch that can have two or more throws active concurrently. Having multiple throws of the switch 75 active concurrently can enable transmission and/or reception of carrier aggregation signals. The switch 75 can also have a single throw active during a single carrier mode. As illustrated, each duplexer of the duplexers 44A, 44B is coupled to separate throws of the switch 75. Similarly, the illustrated duplexers 44A, 44B include a plurality of duplexers coupled to separate throws of the switch 75. Alternatively, instead of duplexers being coupled to each throw the switch 75 as illustrated in FIG. 2D, one or more individual filters of a multiplexer can be coupled to a dedicated throw of a switch coupled between the multiplexer and a common node. For instance, in some implementations, such a switch could have twice as many throws as the illustrated switch 75.

Figure 3A:
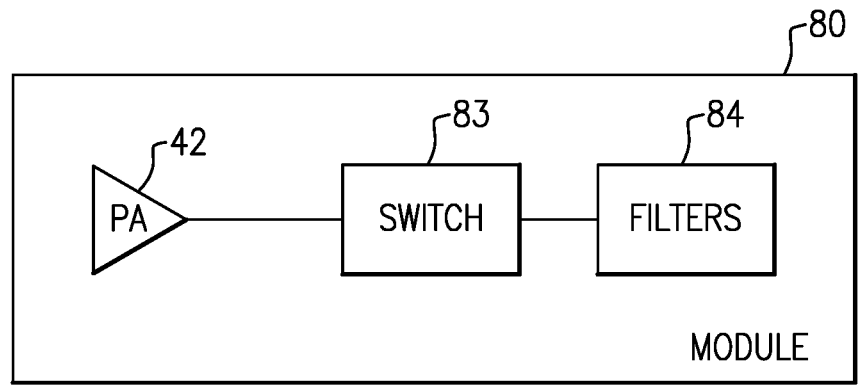
FIG. 3A is a schematic block diagram of a module that includes a filter.
Figure 3B:
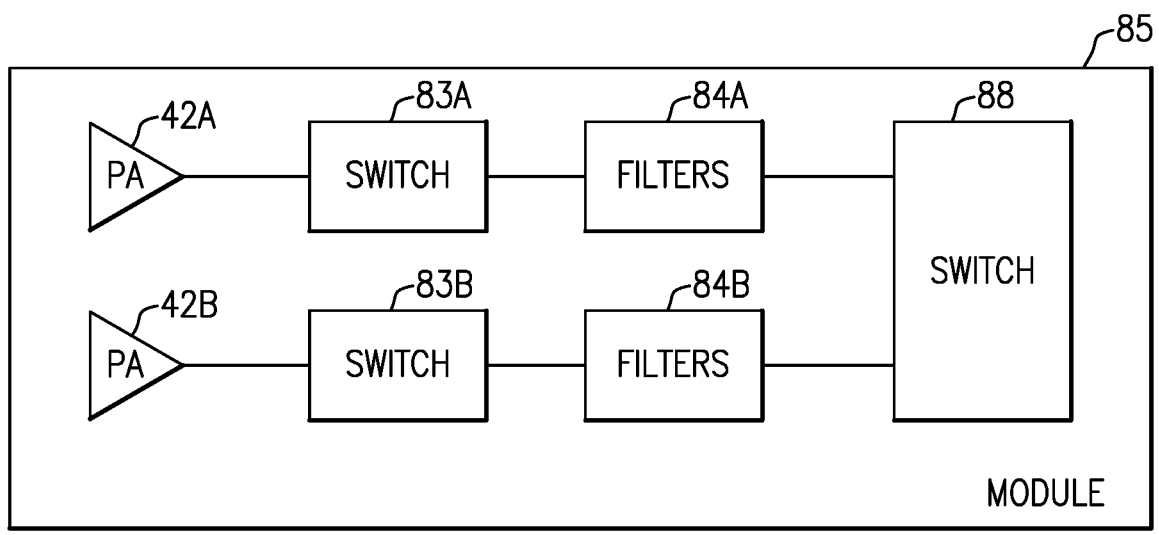
FIG. 3B is a schematic block diagram of a module that includes a filter.

The filters discussed herein can be implemented in a variety of packaged modules. Some examples of packaged modules will now be discussed in which any suitable principles and advantages of the filters discussed herein can be implemented. FIGS. 3A and 3B are schematic block diagrams of illustrative packaged modules according to certain embodiments.

FIG. 3A is a schematic block diagram of a module 80 that includes a power amplifier 42, a switch 83, and filters 84 in accordance with one or more embodiments. The module 80 can include a package that encloses the illustrated elements. The power amplifier 42, a switch 83, and filters 84 can be disposed on the same packaging substrate. The packaging substrate can be a laminate substrate, for example. The switch 83 can be a multi-throw radio frequency switch. The switch 83 can electrically couple an output of the power amplifier 42 to a selected filter of the filters 84. The filters 84 can include any suitable number of surface acoustic wave filters. One or more filters of the filters 84 can be implemented in accordance with any suitable principles and advantages disclosed herein.

FIG. 3B is a schematic block diagram of a module 85 that includes power amplifiers 42A and 42B, switches 83A and 83B, and filters 84A and 84B in accordance with one or more embodiments, and an antenna switch 88. The module 85 is like the module 80 of FIG. 3A, except the module 85 includes an additional RF signal path and the antenna switch 88 arranged to selectively couple a signal from the filters 84A or the filters 84B to an antenna node. One or more filters of the filters 84A and/or 84B can be implemented in accordance with any suitable principles and advantages disclosed herein. The additional RF signal path includes an additional power amplifier 42B, and additional switch 83B, and additional filters 84B. The different RF signal paths can be associated with different frequency bands and/or different modes of operation (e.g., different power modes, different signaling modes, etc.).

In recent years, in the field of information communication devices such as mobile phones, acoustic wave devices having a comb-shaped IDT electrode formed on a surface of a piezoelectric substrate have been used as circuit elements such as resonators, filters, and the like.

Figure 4:
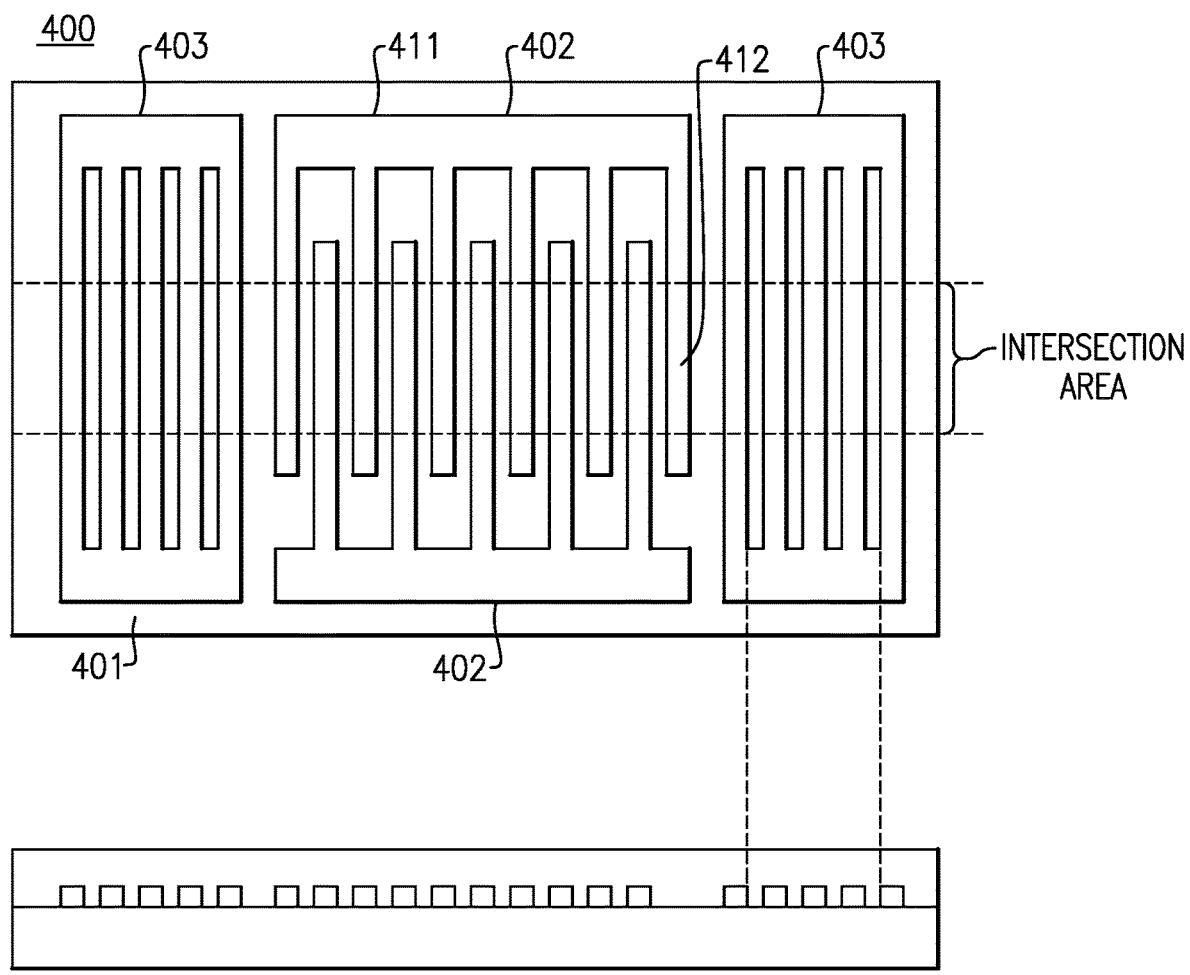
FIG. 4 is a schematic diagram of an example of an acoustic wave device.

FIG. 4 shows an example of such an acoustic wave device. In FIG. 4, a top view of an acoustic wave device 400 is shown. In this description, the acoustic wave device 400 can be also referred to as a resonator. The acoustic wave device 400 is formed by arranging two IDT electrodes 402 and two reflectors 403 on a piezoelectric substrate 401. The IDT electrodes 402 each have a bus bar 411 and a plurality of electrode fingers 412 that extend from the bus bar 411. The respective electrode fingers 412 of each of the IDT electrodes 402 are arranged such that the electrode fingers 412 thereof are arranged interleaved with the respective electrode fingers 412 of the other IDT electrode 402. The reflectors 403 are arranged to interpose the IDT electrodes 402 therebetween.

Figure 5:
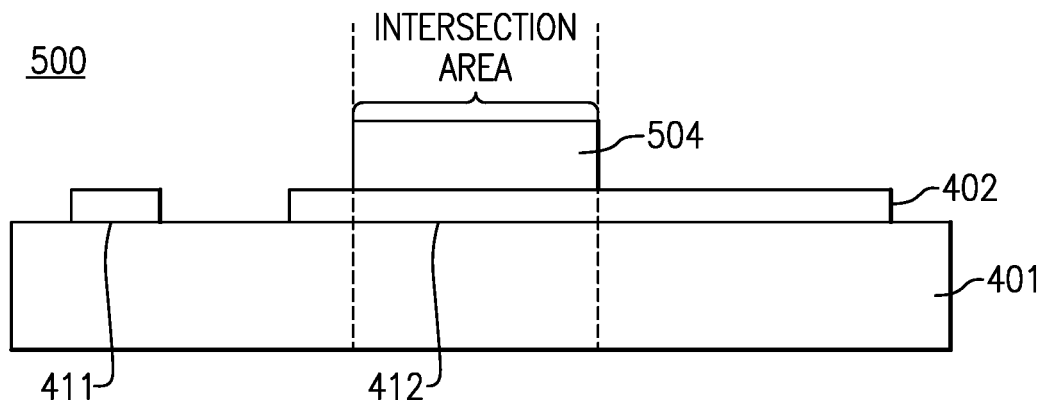
FIG. 5 is a sectional view of the acoustic wave device aligned along a single electrode finger.

FIG. 5 is a sectional view of an acoustic wave device 500 similar to that of FIG. 4 aligned along a single electrode finger 412. In the acoustic wave device 500, propagation of an acoustic wave is concentrated by the coating film 504, thereby suppressing unnecessary high-order transverse mode waves.

Figure 6:
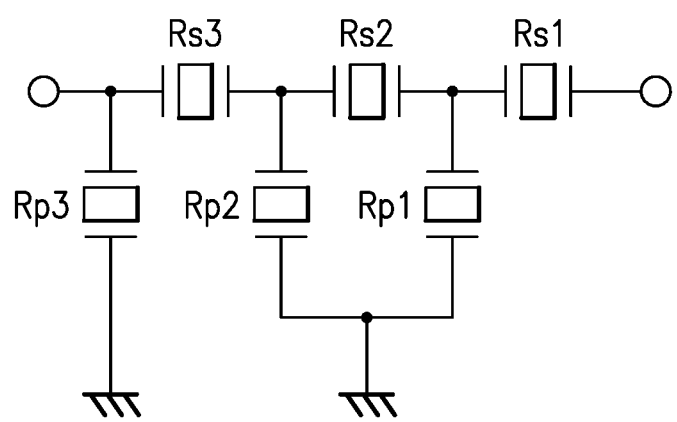
FIG. 6 is a schematic diagram of an acoustic wave filter according to an embodiment.

FIG. 6 is a schematic diagram of an acoustic wave filter 600 according to an embodiment. In this embodiment, the acoustic wave filter 600 is a ladder type filter. The ladder type filter includes a plurality of series resonators (Rs1, Rs2, Rs3) and a plurality of shunt resonators (Rp1, Rp2, Rp3) disposed between nodes between adjacent series resonators (Rs1, Rs2, Rs3) and ground. Each of the plurality of series resonators and shunt resonators of the acoustic wave filter 600 can be implemented by an acoustic wave device as shown in FIG. 4.

The electrical characteristics of the series and shunt resonators can be determined based on the required performance of the acoustic wave filter 600. For example, the resonant frequency of the shunt resonators can be determined based on the targeted frequency range of the rejection band of the acoustic wave filter 600.

Figures 7A, 7B:
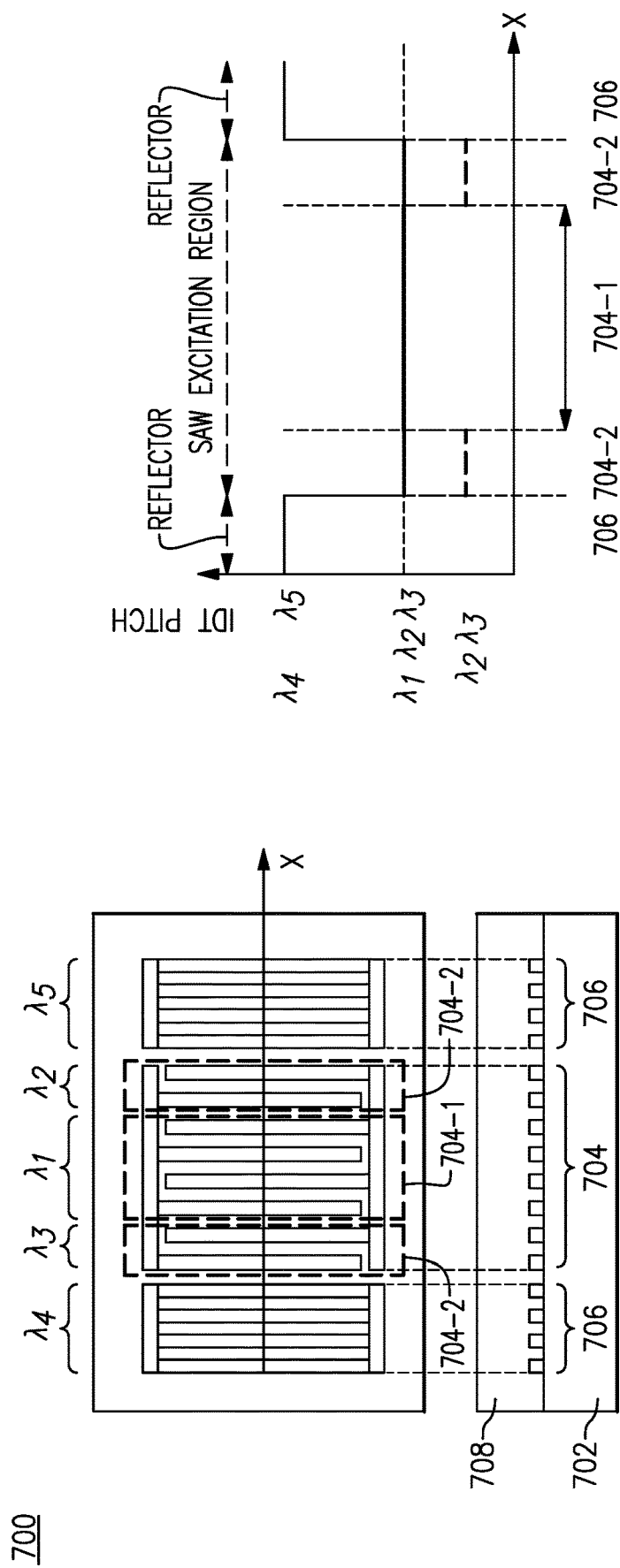
FIG. 7A is a schematic diagram illustrating pitch distance of each part of a resonator according to the prior art.
FIG. 7B illustrates average pitch distances of fingers depending on their location.

FIG. 7A is schematic diagram illustrating a pitch distance of fingers in each part of an example of a resonator 700 according to the prior art. The resonator 700 can be used as one of the plurality of series resonators or one of the plurality of shunt resonators of an acoustic wave filter such as acoustic wave filter 600.

The resonator 700 includes a substrate 702, a pair of IDT electrodes 704, and a dielectric film 708. The resonator 700 may further include a pair of reflectors 706. The substrate 702 is a piezoelectric substrate. The substrate 702 may be formed of lithium niobate ($LiNbO_3$). The pair of IDT electrodes 702 are configured to excite a main wave on the substrate 702. Each of IDT electrodes 702 can be formed of at least one of aluminum (Al), copper (Cu), aluminum-magnesium-copper (AlMgCu) alloy, tungsten (W), platinum (Pt), and/or molybdenum (Mo). The dielectric film 708 is configured to cover at least a part of the substrate 702 and the pair of IDT electrodes 704. The dielectric film 708 is formed of silicon dioxide ($SiO_2$).

Each of the pair of IDT electrodes 704 includes a bus bar extending along a propagating direction x of a main acoustic wave, and a plurality of fingers extending from the bus bar, as illustrated in FIG. 4. The extending direction of the plurality of fingers is perpendicular to the length direction of the bus bar. That is, the plurality of fingers extend in a perpendicular direction to the propagating direction x of the main acoustic wave.

The bus bars of the pair of IDT electrodes 704 are arranged in parallel to each other. The fingers of one IDT electrode extend toward the bus bar of the other IDT electrode. The respective fingers of one IDT electrode are arranged such that the fingers thereof are arranged interleaved with the respective fingers of the other IDT electrode. A pitch of the fingers of one IDT electrode indicates a distance between the respective finger and an adjacent finger of the other IDT electrode.

The pair of IDT electrodes 704 has a center region 704-1 and edge regions 704-2 on both sides of the center region 704-1. The width of the center region 704-1 can be determined based on a desired performance of the acoustic wave filter in which the resonator 700 is used. The edge regions 704-2 of the pair of IDT electrodes 704 are positioned before and after the center region 704-1 along the propagating direction x of the main acoustic wave.

The reflectors 706 interpose the pair of IDT electrodes 704 therebetween. The edge regions 704-2 of the pair of IDT electrodes 704 are positioned on both sides of the center region 704-1 that are adjacent to the reflectors 706. Each of the reflectors 706 includes a pair of bus bars arranged in parallel to each other, and a plurality of fingers connecting the pair of bus bars.

According to the prior art, an average pitch distance ($\lambda_1$) of fingers of the center region 704-1 of the pair of IDT electrodes 704 is equal to or longer than an average pitch distance ($\lambda_2$, $\lambda_3$) of fingers of the edge regions 704-2. In addition, an average pitch distance ($\lambda_4$, $\lambda_5$) of the fingers of the reflectors 706 is longer than the average pitch distance ($\lambda_2$, $\lambda_3$) of the fingers of the edge regions 704-2.

FIG. 7B is example of average pitch distances of fingers of the resonator of FIG. 7A depending on their location. As shown in FIG. 7B, an average pitch distance ($\lambda_1$) of the fingers of the center region 704-1 of the pair of IDT electrodes 704 is equal to or longer than an average pitch distance ($\lambda_2$, $\lambda_3$) of the fingers of the edge regions 704-2. In addition, an average pitch distance ($\lambda_4$, $\lambda_5$) of the fingers of the reflectors 706 is longer than the average pitch distance ($\lambda_2$, $\lambda_3$) of the fingers of the edge regions 704-2.

Figure 8:
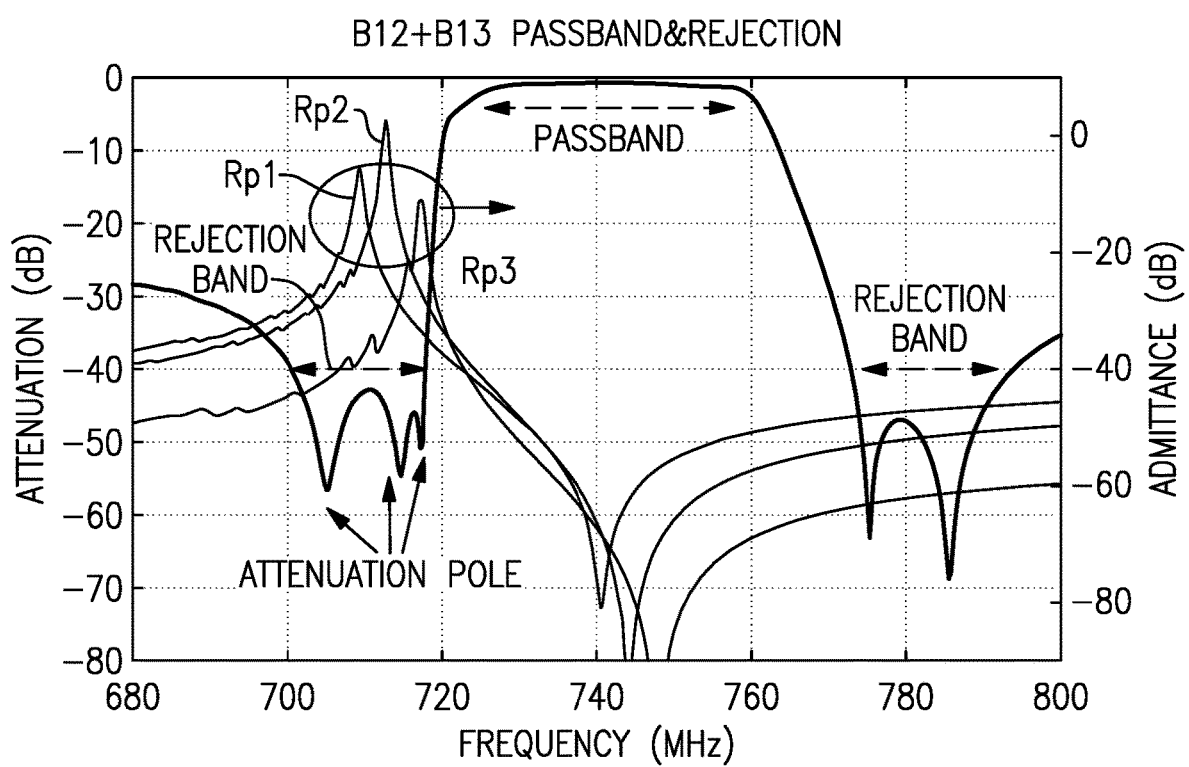
FIG. 8 is an example of passband characteristics of an acoustic wave filter according to the prior art.

FIG. 8 is an example of passband characteristics of an example of an acoustic wave filter according to the prior art. In this example, the acoustic wave filter can be a ladder type filter as shown in FIG. 6. The acoustic wave filter includes a plurality of series resonators (Rs1, Rs2, Rs3) and a plurality of shunt resonators (Rp1, Rp2, Rp3).

As shown in FIG. 8, the acoustic wave filter has a pass band and rejection bands on both sides of the passband. The frequency ranges of the rejection bands of the acoustic wave filter are determined based on the characteristics of the shunt resonators (Rs1, Rs2, Rs3). In particular, the rejection band on the lower frequency side of the passband is affected by the attenuation pole of each of the shunt resonators (Rp1, Rp2, Rp3) that corresponds to the resonant frequency of individual shunt resonators (Rp1, Rp2, Rp3).

As the rejection bands of the acoustic wave filter are broadened, the characteristics of the acoustic wave filter can be improved. Therefore, it is desired to enhance the bandwidth of the rejection bands of the acoustic wave filter such to improve the overall performance of the acoustic wave filter.

Hereinafter, an acoustic wave filter with wide rejection bands according to an embodiment is provided.

Figure 9B:
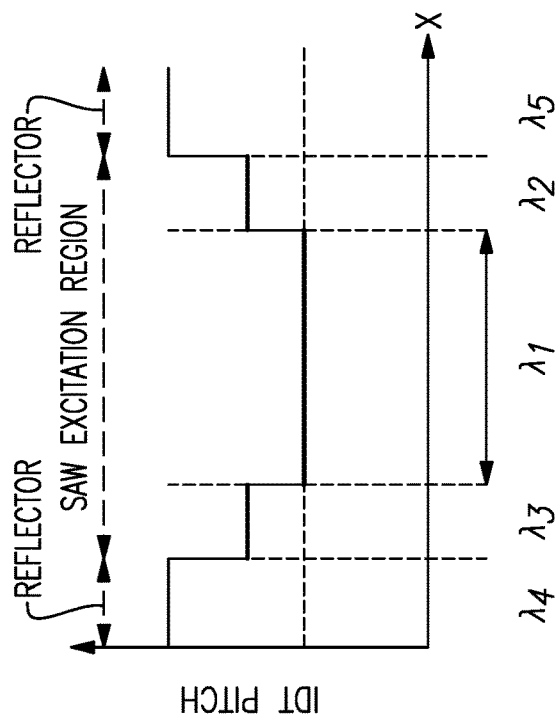
FIG. 9B illustrates average pitch distances of fingers depending on their location according to an embodiment.
Figure 9A:
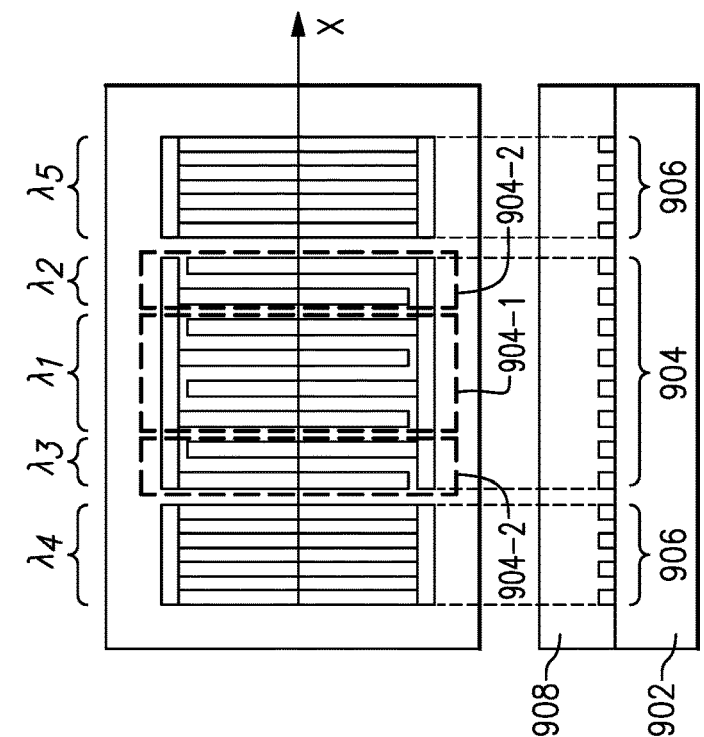
FIG. 9A is a schematic diagram illustrating pitch distance of each part of a resonator according to an embodiment.

FIG. 9A is a schematic diagram illustrating pitch distance of fingers in each part of a resonator 900 according to an embodiment. The resonator 900 can be used as one of the plurality of series resonators or one of the plurality of shunt resonators of the acoustic wave filter 600 as shown in FIG. 6.

The resonator 900 includes a substrate 902, a pair of IDT electrodes 904, and a dielectric film 908. The resonator 900 may further include a pair of reflectors 906. The substrate 902 is a piezoelectric substrate. The substrate 902 may be formed of lithium niobate (LiNbO$_3$). The pair of IDT electrodes 902 are configured to excite a main acoustic wave on the substrate 902. Each IDT electrode 904 can be formed of at least one of aluminum (Al), copper (Cu), aluminum-magnesium-copper (AlMgCu) alloy, tungsten (W), platinum (Pt), and/or molybdenum (Mo). The dielectric film 908 covers at least a part of the substrate 902 and the pair of IDT electrodes 904. The dielectric film 908 is formed of silicon dioxide (SiO$_2$).

Each IDT electrode 904 includes a bus bar extending along a propagating direction x of a main acoustic wave, and a plurality of fingers extending from the bus bar, as illustrated in FIG. 4. The extending direction of the plurality of fingers is perpendicular to the length direction of the bus bar. That is, the plurality of fingers extend in a perpendicular direction to the propagating direction x of the main acoustic wave.

The bus bars of the pair of IDT electrodes 904 are arranged in parallel to each other. The fingers of one IDT electrode extend toward the bus bar of the other IDT electrode. The respective fingers of one IDT electrode are interleaved with the respective fingers of the other IDT electrode. A pitch of a respective finger of one IDT electrode indicates a distance between the respective finger and an adjacent finger of the other IDT electrode.

The pair of IDT electrodes 904 has a center region 904-1 and edge regions 904-2 on both sides of the center region 904-1. The width of the center region 904-1 can be determined based on a desired performance of an acoustic wave filter in which the resonator 900 is used. The edge regions 904-2 of the pair of IDT electrodes 904 are positioned before and after the center region 904-1 along the propagating direction x of a main acoustic wave.

The plurality of fingers of the pair of IDT electrodes 904 include a first group of fingers and a second group of fingers. The first group of fingers is located in the center region 904-1, and the second group of fingers is located in the edge regions 904-2. At least a part of second group of fingers is located on a first side of the center region 904-1 and another part of the second group of fingers is located on a second side of the center region 904-1. The first group of fingers consists of a part of one IDT electrode and a part of the other IDT electrode. The second group of fingers consists of another part of one IDT electrode and another part of the other IDT electrode.

The reflectors 906 interpose the pair of IDT electrodes 904 therebetween. The edge regions 904-2 of the pair of IDT electrodes 904 are positioned on both sides of the center region 904-1 that are adjacent to the reflectors 906. Each of the reflectors 906 includes a pair of bus bars arranged in parallel to each other, and a plurality of fingers connecting the pair of bus bars.

According to an aspect of the present disclosure, an average pitch distance ($\lambda_1$) of the fingers of the center region 904-1 of the pair of IDT electrodes 904 (the first group of fingers) is shorter than an average pitch distance ($\lambda_2$, $\lambda_3$) of the fingers of the edge regions 904-2 (the second group of fingers). The pair of IDT electrodes 904 is configured to induce a longitudinal mode response. The longitudinal mode response is formed by waves confined in a resonant cavity of the acoustic wave filter. The longitudinal mode of a resonant cavity is a particular standing wave pattern formed by waves confined in the cavity. In this manner, the bandwidths of the rejection bands of the acoustic wave filter may be increased. Each finger of the first group of fingers has different pitch distance with adjacent fingers. The pitch distance of each finger can be determined based on the desired performance of the acoustic wave filter, such as frequency range of the passband. By intentionally inducing the longitudinal mode response in at least one shunt resonator, the bandwidths of the rejection bands of the acoustic wave filter can be increased.

In addition, an average pitch distance ($\lambda_4$, $\lambda_5$) of the fingers of the reflectors 906 are longer than the average pitch distance ($\lambda_2$, $\lambda_3$) of the fingers of the edge regions 904-2.

FIG. 9B is example of average pitch distances of fingers depending on their location according to an embodiment. As shown in FIG. 9B, the average pitch distance ($\lambda_1$) of fingers of the center region 904-1 of the pair of IDT electrodes 904 (the first group of fingers) is shorter than the average pitch distance ($\lambda_2$, $\lambda_3$) of the fingers of the edge regions 904-2 (the second group of fingers). In addition, the average pitch distance ($\lambda_4$, $\lambda_5$) of the fingers of the reflectors 906 is longer than the average pitch distance ($\lambda_2$, $\lambda_3$) of the fingers of the edge regions 904-2.

Figure 10A:
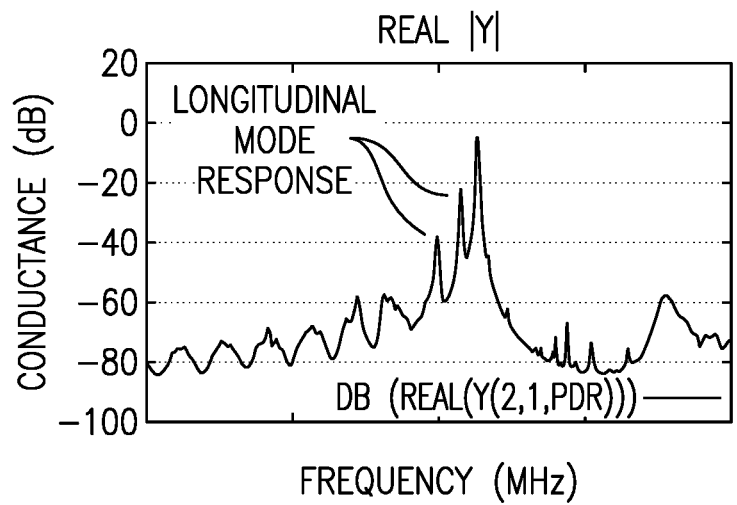
FIG. 10A is an example of the frequency response of a resonator according to an embodiment.

FIG. 10A is an example of frequency response of a resonator according to an embodiment. The Y-axis of FIG. 10A indicates conductance [dB] of the resonator and the X-axis indicates frequency. As shown in FIG. 10A, the response of the resonator has many peaks in conductance values, which represent a longitudinal mode response.

Figure 10B:
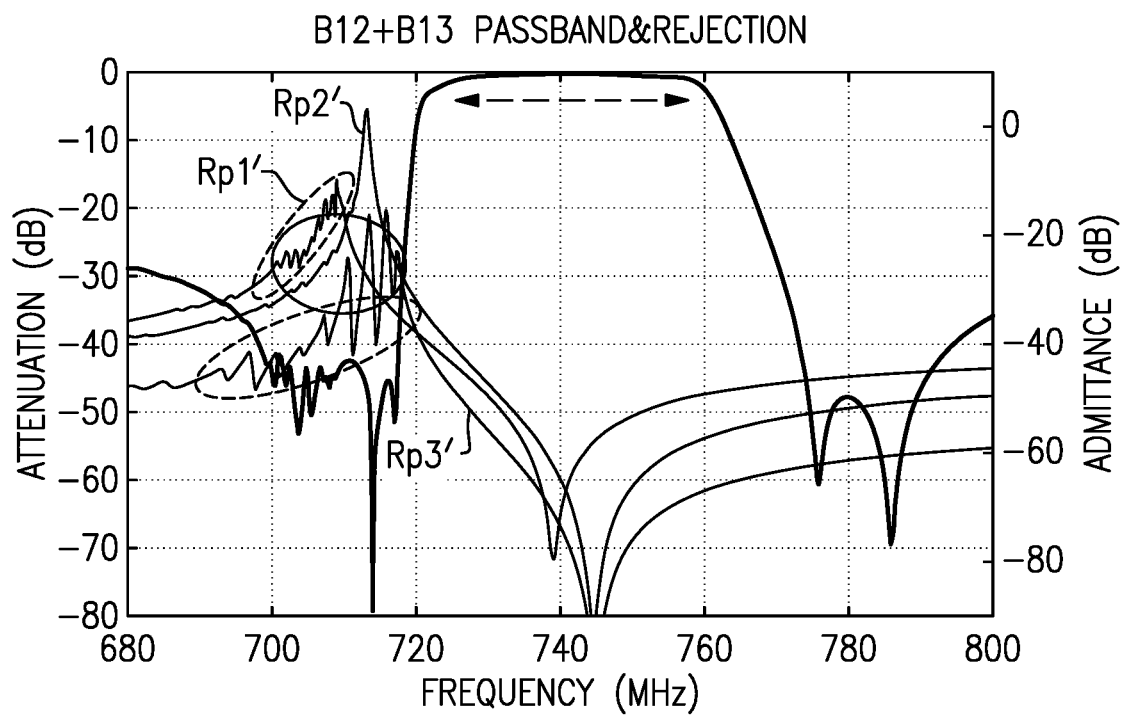
FIG. 10B is an example of the passband characteristics of an acoustic wave filter according to an embodiment.

FIG. 10B is an example of passband characteristics of an acoustic wave filter according to an embodiment. In this embodiment, the acoustic wave filter can be a ladder type filter as shown in FIG. 6. The acoustic wave filter includes a plurality of series resonators (Rs1, Rs2, Rs3) and a plurality of shunt resonators (Rp1', Rp2', Rp3').

As shown in FIG. 10B, the acoustic wave filter according to the embodiment has a pass band and rejection bands on both sides of the passband. The rejection bands of the acoustic wave filter are determined based on the frequency response of each of the shunt resonators (Rp1', Rp2', Rp3'). In particular, the rejection band in the frequency range below the passband is affected by the longitudinal mode response from each of the shunt resonators. In other words, the resonant frequencies of the shunt resonators (Rp1', Rp2', Rp3') are located in the rejection band of the acoustic wave filter, and the longitudinal mode responses that appear in vicinity of the resonant frequencies of each shunt resonator (Rp1', Rp2', Rp3') affects the characteristics of the rejection band of the acoustic wave filter.

Figure 11:
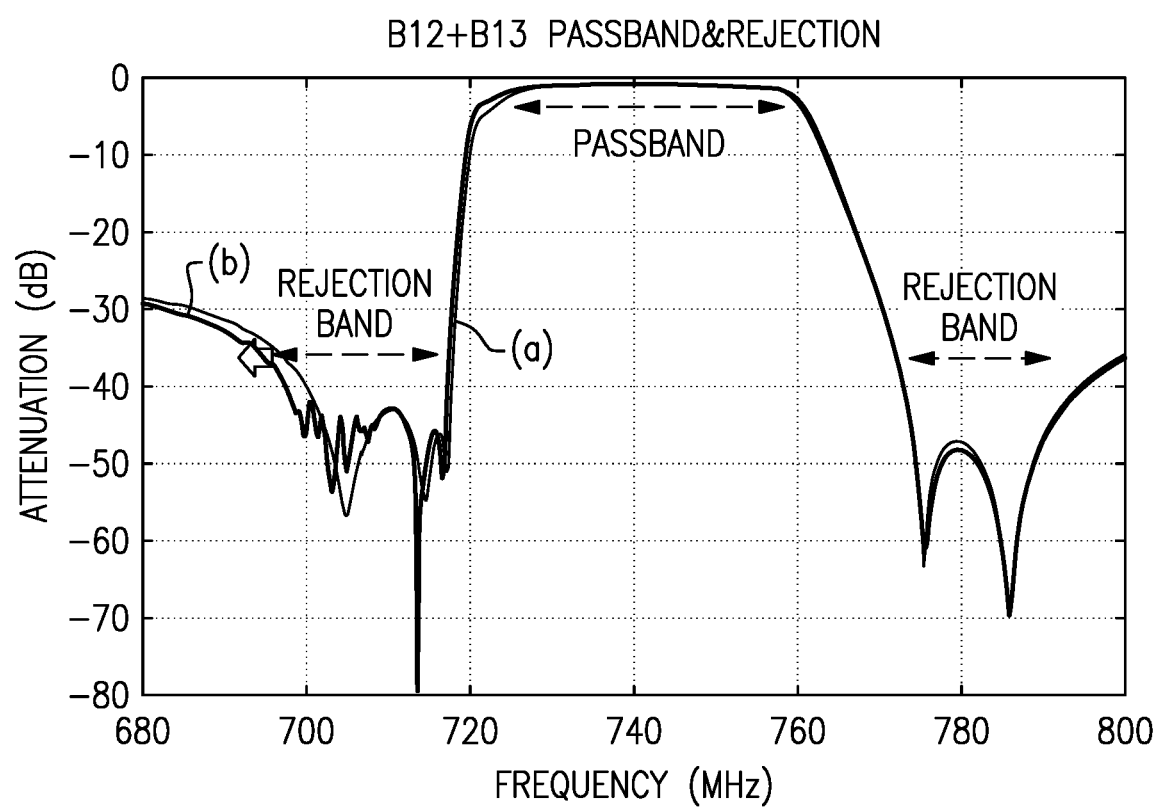
FIG. 11 is an example of the passband characteristics of an acoustic wave filter according to an embodiment.

FIG. 11 is an example of passband characteristics of an acoustic wave filter according to an embodiment. In this embodiment, the acoustic wave filter can be a ladder type filter as shown in FIG. 6. The acoustic wave filter includes a plurality of series resonators (Rs1, Rs2, Rs3) and a plurality of shunt resonators (Rp1', Rp2', Rp3').

As shown in FIG. 11, the acoustic wave filter according to an embodiment has broader rejection band (curve (b)) in the frequency range below the passband as compared to the rejection band (curve (a)) of the acoustic wave filter according to the prior art. Since the shunt resonators (Rp1', Rp2', Rp3') according to this embodiment are configured to induce the longitudinal mode response, the rejection band of the acoustic wave filter does not have attenuation poles. Therefore, the bandwidth of the rejection band of the acoustic wave filter according to this embodiment can be increased.

Figure 12A:
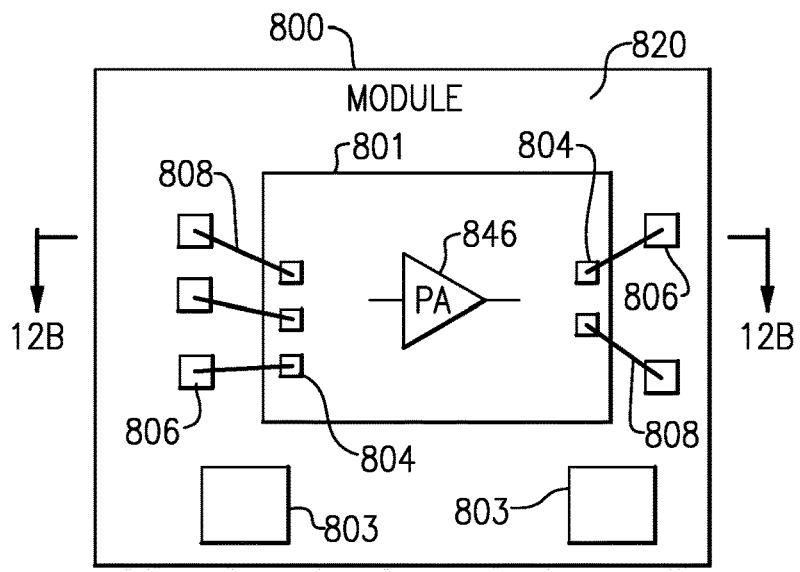
FIG. 12A is a schematic diagram of one embodiment of a packaged module.
Figure 12B:
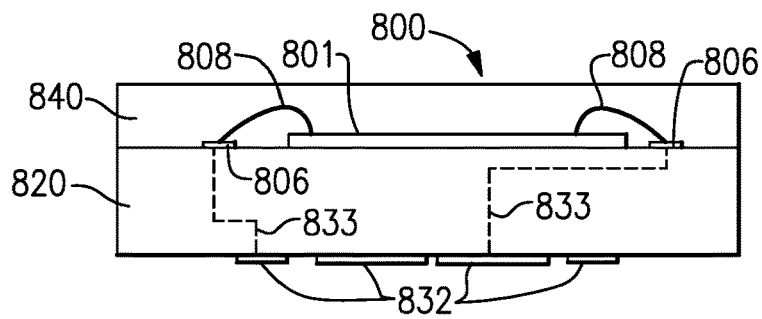
FIG. 12B is a cross-section of the packaged module of FIG. 12A taken along the lines 12B-12B.

FIG. 12A is a schematic diagram of one embodiment of a packaged module 800. FIG. 12B is a schematic diagram of a cross-section of the packaged module 800 of FIG. 12A taken along the lines 12B-12B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 electrically connect the pads 804 of the die 801 to the pads 806 of the package substrate 820.

The die 801 includes a filter module and a power amplifier 846, which can be implemented in accordance with any of the embodiments herein.

The packaging substrate 820 can be configured to receive a plurality of components such as the die 801 and the surface mount components 803, which can include, for example, surface mount capacitors and/or inductors.

As shown in FIG. 12B, the packaged module 800 includes a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The contact pads 832 can be configured to provide RF signals, bias signals, power low voltage(s) and/or power high voltage(s) to the die 801 and/or the surface mount components 803. As shown in FIG. 12B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 13:
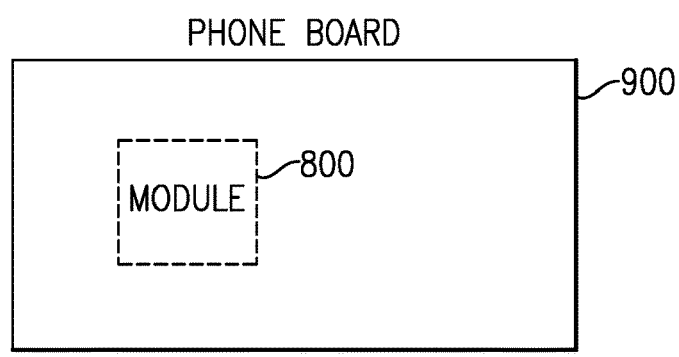
FIG. 13 is a schematic diagram of one embodiment of a phone board.

FIG. 13 is a schematic diagram of one embodiment of a phone board 900. The phone board 900 includes the module 800 shown in FIGS. 12A-12B attached thereto. Although not illustrated in FIG. 13 for clarity, the phone board 800 can include additional components and structures.

Some of the embodiments described above have provided examples in connection with wireless devices or mobile phones. However, the principles and advantages of the embodiments can be used for any other systems or apparatus that have needs for power amplifiers.

Embodiments as disclosed herein can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description is not intended to be exhaustive or to limit the disclosed embodiments to the precise form disclosed above. While specific embodiments are described above for illustrative purposes, various equivalent modifications are possible within the scope of this disclosure, as those skilled in the relevant art will recognize The teachings provided herein can be applied to other systems, not necessarily the system described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An acoustic wave filter comprising:
   a plurality of series resonators;
   a plurality of shunt resonators disposed between the series resonators and a ground, at least one shunt resonator of the plurality of shunt resonators including a substrate and a pair of interdigital transducer (IDT) electrodes disposed on the substrate, each of the IDT electrodes including a bus bar and a plurality of fingers extending from the bus bar, fingers of one IDT electrode arranged interleaved with respective fingers of the other IDT electrode, the plurality of fingers of the pair of IDT electrodes including a first group of fingers located at a center region of the pair of IDT electrodes and a second group of fingers located at edge regions on both sides of the center region, the first group of fingers having an average pitch distance shorter than an average pitch distance of the second group of fingers such to improve a response at a rejection band of the acoustic wave filter, the at least one shunt resonator being configured to induce a longitudinal mode response formed by waves confined in a resonant cavity of the acoustic wave filter, such to increase a bandwidth of the rejection band of the acoustic wave filter; and
   a dielectric film formed to cover at least a part of the substrate and the pair of IDT electrodes.

2. The acoustic wave filter of claim 1 wherein a pitch distance of each finger from one IDT electrode is defined with respect to adjacent fingers from the other IDT electrode.

3. The acoustic wave filter of claim 1 wherein a width of the center region is determined based on a desired performance of the acoustic wave filter.

4. The acoustic wave filter of claim 1 wherein a direction of which the fingers of the pair of IDT electrodes are extended is perpendicular to a propagating direction of a main acoustic wave.

5. The acoustic wave filter of claim 1 wherein the at least one shunt resonator has a resonant frequency in a range of the rejection band of the acoustic wave filter.

6. The acoustic wave filter of claim 5 wherein a longitudinal mode response of the at least one shunt resonator is induced in vicinity of the resonant frequency of the at least one shunt resonator.

7. The acoustic wave filter of claim 1 further comprising a pair of reflectors arranged so as to interpose the pair of IDT electrodes therebetween.

8. The acoustic wave filter of claim 7 wherein each of the pair of reflectors includes a plurality of fingers having an average pitch distance longer than the average pitch distance of the second group of fingers of the pair of IDT electrodes.

9. The acoustic wave filter of claim 1 wherein each finger of the first group of fingers has different pitch distance depending on a required performance of the acoustic wave filter.

10. A radio frequency module comprising:
    a packaging board configured to receive a plurality of components;
    an acoustic wave filter implemented on the packaging board, the acoustic wave filter including a plurality of series resonators and a plurality of shunt resonators disposed between the series resonators and a ground, at least one shunt resonator of the plurality of shunt resonators including a substrate and a pair of IDT electrodes disposed on the substrate, each of the IDT electrodes including a bus bar and a plurality of fingers extending from the bus bar, fingers of one IDT electrode arranged interleaved with respective fingers of the other IDT electrode, the plurality of fingers of the pair of IDT electrodes including a first group of fingers located in a center region of the pair of IDT electrodes and a second group of fingers located in edge regions on both sides of the center region, the first group of fingers having an average pitch distance shorter than an average pitch distance of the second group of fingers such to improve a response at a rejection band of the acoustic wave filter, the at least one shunt resonator being configured to induce a longitudinal mode response formed by waves confined in a resonant cavity of the acoustic wave filter, such to increase a bandwidth of the rejection band of the acoustic wave filter; and
    a dielectric film formed to cover at least a part of the substrate and the pair of IDT electrodes.

11. The radio frequency module of claim 10 wherein the radio frequency module is a front-end module.

12. The radio frequency module of claim 10 wherein a pitch distance of each finger from one IDT electrode is defined with respect to adjacent fingers from the other IDT electrode.

13. The radio frequency module of claim 10 wherein a width of the center region is determined based on a desired performance of the acoustic wave filter.

14. The radio frequency module of claim 10 wherein a direction of which the fingers of the pair of IDT electrodes are extended is perpendicular to a propagating direction of a main acoustic wave.

15. The radio frequency module of claim 10 wherein the at least one shunt resonator has a resonant frequency in a range of the rejection band of the acoustic wave filter.

16. The radio frequency module of claim 15 wherein a longitudinal mode response of the at least one shunt resonator is induced in vicinity of the resonant frequency of the at least one shunt resonator.

17. The radio frequency module of claim 10 further comprising a pair of reflectors arranged so as to interpose the pair of IDT electrodes therebetween.

18. The radio frequency module of claim 17 wherein each of the pair of reflectors includes a plurality of fingers having an average pitch distance longer than the average pitch distance of the second group of fingers of the pair of IDT electrodes.

19. The radio frequency module of claim 10 wherein each finger of the first group of fingers has different pitch distance depending on a required performance of the acoustic wave filter.

20. A mobile device comprising the radio frequency module of claim 10.

21. A radio frequency module comprising:
a packaging board configured to receive a plurality of components;
an acoustic wave filter implemented on the packaging board, the acoustic wave filter including a plurality of series resonators and a plurality of shunt resonators disposed between the series resonators and a ground, at least one shunt resonator of the plurality of shunt resonators including a substrate and a pair of IDT electrodes disposed on the substrate, each of the IDT electrodes including a bus bar and a plurality of fingers extending from the bus bar, fingers of one IDT electrode arranged interleaved with respective fingers of the other IDT electrode, the plurality of fingers of the pair of IDT electrodes including a first group of fingers located in a center region of the pair of IDT electrodes and a second group of fingers located in edge regions on both sides of the center region, the first group of fingers having an average pitch distance shorter than an average pitch distance of the second group of fingers such to improve a response at a rejection band of the acoustic wave filter, the at least one shunt resonator having a resonant frequency in a range of the rejection band of the acoustic wave filter, the at least one shunt resonator configured to induce a longitudinal mode response in vicinity of the resonant frequency of the at least one shunt resonator; and
a dielectric film formed to cover at least a part of the substrate and the pair of IDT electrodes.

\* \* \* \* \*